(12) United States Patent
Yoshida et al.

(10) Patent No.: US 10,211,157 B2
(45) Date of Patent: Feb. 19, 2019

(54) ELECTRONIC COMPONENT

(71) Applicant: TDK CORPORATION, Tokyo (JP)

(72) Inventors: Kenichi Yoshida, Tokyo (JP);
Mitsuhiro Tomikawa, Tokyo (JP);
Eiko Wakata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/633,013

(22) Filed: Jun. 26, 2017

(65) Prior Publication Data

US 2017/0373009 A1      Dec. 28, 2017

(30) Foreign Application Priority Data

Jun. 27, 2016   (JP) ................................. 2016-126688
May 2, 2017    (JP) ................................. 2017-091897

(51) Int. Cl.
*H01L 23/538* (2006.01)
*H01G 4/005* (2006.01)
*H01G 4/228* (2006.01)
*H05K 1/16* (2006.01)
*H01G 4/33* (2006.01)
*H01G 4/40* (2006.01)
*H01G 4/232* (2006.01)

(52) U.S. Cl.
CPC ......... *H01L 23/5385* (2013.01); *H01G 4/005* (2013.01); *H01G 4/228* (2013.01); *H01G 4/232* (2013.01); *H01G 4/33* (2013.01); *H01G 4/40* (2013.01); *H05K 1/162* (2013.01); *H05K 2201/0195* (2013.01); *H05K 2201/09063* (2013.01); *H05K 2201/09072* (2013.01); *H05K 2201/10015* (2013.01); *H05K 2201/10537* (2013.01); *H05K 2201/10545* (2013.01)

(58) Field of Classification Search
CPC ........... H01G 4/30; H01G 4/385; H01G 2/103
See application file for complete search history.

(56) References Cited

U.S. PATENT DOCUMENTS

2008/0072409 A1   3/2008   Kato et al.
2010/0093150 A1   4/2010   Kato et al.

FOREIGN PATENT DOCUMENTS

| JP | 2000195753 A | * | 7/2000 |
| JP | 2008-034417 A | | 2/2008 |
| JP | 2008-034418 A | | 2/2008 |

* cited by examiner

*Primary Examiner* — Ermias T Woldegeorgis
(74) *Attorney, Agent, or Firm* — Oliff PLC

(57) ABSTRACT

An electronic component includes a first electronic component and a second electronic component that is stacked on the first electronic component. A second electrode layer of the first electronic component includes a plurality of divided electrode layers, and a pair of electrodes of the second electronic component are electrically connected to different electrode layers included in the plurality of electrode layers of the second electrode layer, and a first electrode layer of the first electronic component is divided into a plurality of electrode layers to correspond to the electrode layers which are included in the second electrode layer and which are electrically connected to the pair of electrodes of the second electronic component.

6 Claims, 7 Drawing Sheets

ELECTRONIC COMPONENT

TECHNICAL FIELD

The present invention relates to an electronic component

BACKGROUND

There is a demand for an improvement in signal quality in passive components which are used for an electronic component mounting board. In this regard, for example, Japanese Unexamined Patent Publication No. 2008-34417 and Japanese Unexamined Patent Publication No. 2008-34418 disclose a method of manufacturing a so-called thin-film capacitor including a metal film, a dielectric layer, and a metal foil. In such thin-film capacitors as those described in Japanese Unexamined Patent Publication No. 2008-34417 and Japanese Unexamined Patent Publication No. 2008-34418, it is known that they are advantageous because equivalent series inductance (ESL), which has an influence on signal quantity in a high-frequency range, can be lowered more than in a related art.

SUMMARY

However, with an improvement in function of electronic devices, there is a demand for a further improvement in electronic components which are used in the electronic devices in view of compatibility between an increase in capacity and an improvement in signal quantity in a high-frequency range. With the improvement in function of electronic devices, combinations of a plurality of electronic components, such as capacitors, may be used more and more. Accordingly, there is a demand for an efficient arrangement and connection of electronic components.

The present invention is made in consideration of the above-mentioned circumstances, and an object thereof is to provide an electronic component in which a plurality of electronic components can be efficiently arranged and connected.

In order to achieve the above-mentioned object, according to an aspect of the present invention, there is provided an electronic component including: a first electronic component that includes a first functional layer and a first and second electrode layer which are disposed to interpose the first functional layer therebetween; and a second electronic component that is stacked on the first electronic component and includes a second functional layer and at least a pair of electrodes which are disposed to interpose the second functional layer therebetween, wherein the second electrode layer of the first electronic component includes a plurality of divided electrode layers, and the pair of electrodes of the second electronic component are each electrically connected to different electrode layers which are included in the plurality of electrode layers of the second electrode layer.

According to this electronic component, an electronic component in which two electronic components are combined is formed by connecting the pair of electrodes of the second electronic component to different electrode layers included in the second electrode layer of the first electronic component. Accordingly, it is possible to efficiently arrange and connect a plurality of electronic components according to this electronic component.

According to another aspect of the present invention, there is provided an electronic component including: a first electronic component that includes a dielectric layer and a first and second electrode layer which are disposed to interpose the dielectric layer therebetween; and a second electronic component that is stacked on the first electronic component and includes a dielectric and a pair of electrodes which are disposed to interpose the dielectric therebetween, wherein the second electrode layer of the first electronic component includes a plurality of divided electrode layers, the pair of electrodes of the second electronic component are each electrically connected to different electrode layers which are included in the plurality of electrode layers of the second electrode layer, the first electrode layer of the first electronic component is divided into a plurality of electrode layers to correspond to the electrode layers which are included in the second electrode layer and which are electrically connected to the pair of electrodes of the second electronic component, capacitance of the second electronic component is greater than capacitance of the first electronic component, and equivalent series inductance of the second electronic component is greater than equivalent series inductance of the first electronic component.

In this electronic component, since the capacitance of the electronic component can be covered with the capacitance of the second electronic component by the second electronic component, which has capacitance greater than that of the first electronic component, being stacked on and connected to the first electronic component, it is possible to easily achieve an increase in capacity. The electrode layers constituting the second electrode layer of the first electronic component having equivalent series inductance lower than the second electronic component are electrically connected to the pair of electrodes of the second electronic component, and can be connected to an external electronic component via a plurality of divided first electrode layers which are disposed to correspond to the electrode layers. The first electronic component is lower in equivalent series inductance than the second electronic component. Since, when a current flows in the first electronic component and the second electronic component, a magnetic field is cancelled depending on a flow direction of the current, it is possible to reduce equivalent series inductance. Accordingly, it is possible to enable an increase in capacity and an improvement in signal quality in a high-frequency range to be compatible according to this electronic component.

Here, a part of an area in the first electrode layer corresponding to the electrode layers which are included in the second electrode layer and electrically connected to the pair of electrodes of the second electronic component may be divided into a plurality of areas.

Since the equivalent series inductance of the electronic component can be further reduced by employing the configuration in which a part of the area corresponding to the electrode layers which are included in the second electrode layer and electrically connected to the pair of electrodes of the second electronic component is divided into a plurality of areas as described above, it is possible to further improve signal quality in a high-frequency range of the electronic component.

An insulating material that comes into contact with the first electronic component and the second electronic component may be disposed in an area which is disposed between the first electronic component and the second electronic component and which is different from an area in which both electronic components are electrically connected to each other.

Since the insulating material physically connects the first electronic component and the second electronic component by employing the configuration in which the insulating material is disposed between the first electronic component and the second electronic component as described above, it is possible to improve durability of the electronic component. It is also possible to enhance insulating reliability in the electronic component by providing the insulating material.

A conductive material may be disposed between the pair of electrodes of the second electronic component and the electrode layers which are included in the second electrode layer and which are electrically connected to the pair of electrodes of the second electronic component.

In the configuration in which the first electronic component and the second electronic component are electrically connected to each other via the conductive material as described above, the conductive material can physically connect the first electronic component and the second electronic component to each other, and thus it is possible to improve durability of the electronic component.

According to the invention, it is possible to provide an electronic component in which a plurality of electronic components can be efficiently arranged and connected.

DETAILED DESCRIPTION

Hereinafter, embodiments of the invention will be described in detail with reference to the accompanying drawings. In the descriptions referencing the drawings, the same elements will be referenced with the same reference signs and descriptions thereof will not be repeated.

Figure 1:
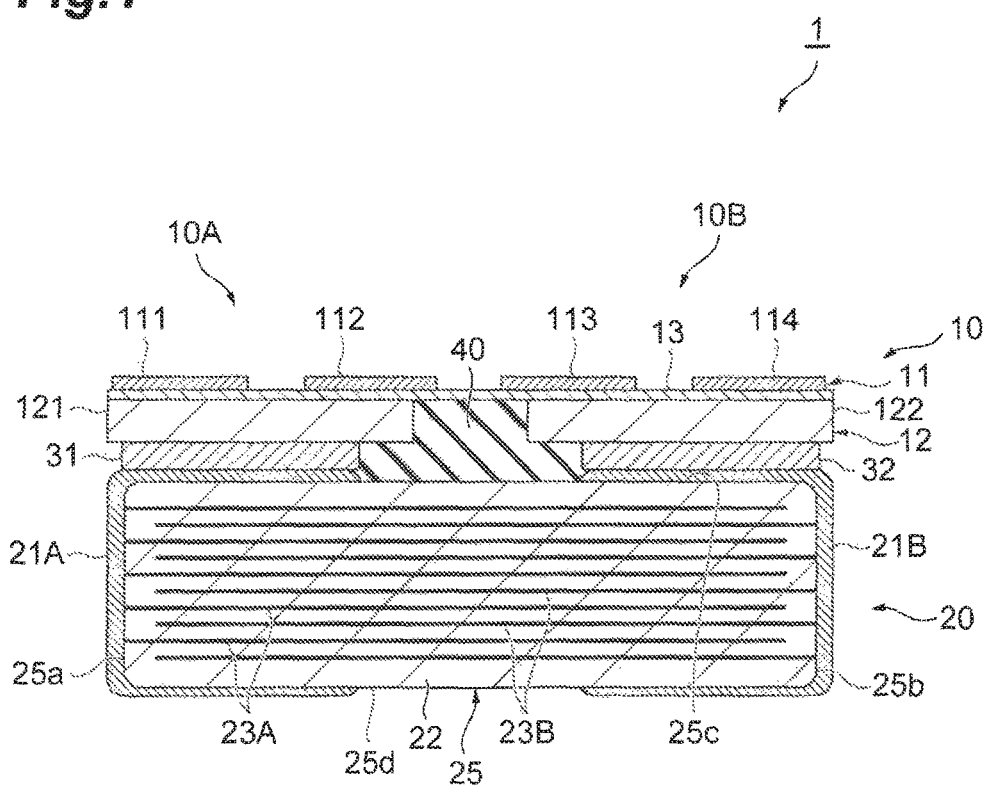
FIG. 1 is a cross-sectional view schematically illustrating an electronic component according to an embodiment of the invention.

FIG. 1 is a cross-sectional view schematically illustrating an electronic component according to an embodiment of the invention. An electronic component 1 illustrated in FIG. 1 functions as a capacitor which is a type of passive component that can be used in an electronic device such as a communication terminal.

As illustrated in FIG. 1, the electronic component 1 includes a first electronic component 10 and a second electronic component 20. The first electronic component 10 and the second electronic component 20 are stacked in a vertical direction in the drawing and are connected to each other via conductive materials 31 and 32 having electrical conductivity.

The first electronic component 10 is a thin-film capacitor including a pair of electrode layers, which include a first electrode layer 11 and a second electrode layer 12, and a dielectric layer 13, which is a first functional layer disposed between the pair of electrode layers. In this embodiment, it is assumed that the first electronic component 10 is a thin-film capacitor (TFC) in which the first electrode layer 11 is formed of a metal film and the dielectric layer 13 is formed of a dielectric film. A total thickness of three layers in the first electronic component 10 is set to range from about 5 μm to 650 μm, where a thickness of the first electrode layer 11 can range from about 0.1 μm to 50 μm, a thickness of the dielectric layer 13 can range from about 0.05 μm to 100 μm, and a thickness of the second electrode layer 12 can range from about 0.1 μm to 500 μm.

Each of the first electrode layer 11 and the second electrode layer 12 is divided into a plurality of electrode layers. In the example illustrated in FIG. 1, the first electrode layer 11 is divided into four electrode layers 111 to 114. The second electrode layer 12 is divided into two electrode layers 121 and 122. The electrode layers 111 and 112 constituting the first electrode layer 11 and the electrode layer 121 constituting the second electrode layer 12 are disposed to face each other with the dielectric layer 13 interposed therebetween, and the electrode layers 111 and 112, the electrode layer 121, and the dielectric layer 13 between the electrode layers function as a single capacitor 10A. Similarly, the electrode layers 113 and 114 constituting the first electrode layer 11 and the electrode layer 122 constituting the second electrode layer 12 are disposed to face each other with the dielectric layer 13 interposed therebetween, and the electrode layers 113 and 114, the electrode layer 122, and the dielectric layer 13 between the electrodes function as a single capacitor 10B. In this way, the first electrode layer 11 is also divided into a plurality of electrode layers to correspond to the two divided electrode layers 121 and 122. Accordingly, it can be said that the capacitors 10A and 10B are integrally formed using a single dielectric layer 13 in the first electronic component 10.

The second electrode layer 12 is a layer which is used for an electrical connection to the second electronic component 20. Accordingly, division of the second electrode layer 12 can be appropriately changed depending on a shape of an electrode of the second electronic component 20, which will be described later.

As a material of the first electrode layer 11 and the second electrode layer 12 of the first electronic component 10, materials of which a main component is nickel (Ni), copper (Cu), aluminum (Al), platinum (Pt), or alloys or intermetallic components containing these metals can be suitably used. The material of the first electrode layer 11 and the second electrode layer 12 is not particularly limited as long as it is a conductive material. In this embodiment, it is assumed that the first electrode layer 11 (the electrode layers 111 to 114) contains copper as a main component and the second electrode layer 12 (the electrode layers 121 and 122) contains nickel as a main component. "Main component" means that a proportion of the component is 50 mass % or more. For example, the first electrode layer 11 and the second electrode layer 12 may be formed with a multi-layer structure of two or more metals in addition to alloys or intermetallic compounds. For example, the electrode layers may be formed with a two-layered structure in which a Cu film is formed on a Ni film. When pure Ni is used as the first electrode layer 11 and/or the second electrode layer 12, it is preferable that a purity of Ni be 99.99% or more. In an alloy containing Ni, a metal which is contained therein as a metal other than Ni may be at least one metal selected from a group consisting of platinum (Pt), palladium (Pd), iridium (Ir), rhodium (Rh), ruthenium (Ru), osmium (Os), rhenium (Re), tungsten (W), chromium (Cr), tantalum (Ta), silver (Ag), and copper (Cu).

The dielectric layer 13 is formed of a perovskite type dielectric material. Examples of the perovskite type dielectric material in this embodiment include a (ferroelectric) dielectric material having a perovskite structure such as $BaTiO_3$ (barium titanate), $(Ba_{1-X}Sr_X)TiO_3$ (barium strontium titanate), $(Ba_{1-X}Ca_X)TiO_3$, $PbTiO_3$, or $Pb(Zr_XTi_{1-X})O_3$, or a complex perovskite relaxer type ferroelectric material such as $Pb(Mg_{1/3}Nb_{2/3})O_3$. Here, in the perovskite structure or the perovskite relaxer type ferroelectric material, a ratio of site A and site B is normally an integer ratio, but may intentionally depart from an integer ratio for the purpose of an improvement in characteristics. For the purpose of control of characteristics of the dielectric layer 13, an additive may be appropriately added to the dielectric layer 13 as a secondary component.

The total thickness of three layers of the first electronic component 10 can be set to range from about 5 µm to 200 µm, wherein the thickness of each of the first electrode layer 11 and the second electrode layer 12 ranges from about 2 µm to 50 µm and the thickness of the dielectric layer 13 ranges from about 1 µm to 100 µm.

The second electronic component 20 is a capacitor including at least a pair of electrodes and a dielectric layer as a second functional layer which is disposed between the pair of electrodes, and is disposed to be stacked on the first electronic component 10. A stacking direction of the first electronic component 10 and the second electronic component 20 is the same as a stacking direction of the first electrode layer 11, the dielectric layer 13, and the second electrode layer 12 constituting the first electronic component 10. In this embodiment, it is assumed that the second electronic component 20 includes a pair of electrodes, but the number of electrodes may be more.

In this embodiment, it is assumed that the second electronic component 20 is a multi-layer ceramic capacitor (MLCC). The second electronic component 20 includes a pair of connection electrodes 21A and 21B and an element body 25 that is disposed between the pair of connection electrodes 21A and 21B and that is formed in a substantially rectangular parallelepiped shape by stacking and integrating a plurality of plate-shaped ceramic green sheets. The element body 25 includes a pair of end surfaces 25a and 25b which face each other in a length direction of the element body 25 and are parallel to each other, a pair of principal surfaces 25c and 25d which extend to connect the pair of end surfaces 25a and 25b and face each other, and a pair of side surfaces (not illustrated) which extend to connect the pair of principal surfaces 25c and 25d and face each other. An extending direction of the pair of principal surfaces 25c and 25d is the same as an extending direction of the first electrode layer 11, the second electrode layer 12, and the dielectric layer 13 of the first electronic component 10. An extending direction of the end surfaces 25a and 25b is the same as the stacking direction of the first electrode layer 11, the second electrode layer 12, and the dielectric layer 13 of the first electronic component 10.

The connection electrode 21A is formed to cover one end surface 25a and parts of edge portions of the two principal surfaces 25c and 25d perpendicular to the end surface 25a.

The connection electrode 21B is formed to cover the other end surface 25b and parts of edge portions of the two principal surfaces 25c and 25d perpendicular to the end surface 25b. In the second electronic component 20, for example, a length thereof is set to range from about 0.2 mm to 2.2 mm, a width thereof is set to range from about 0.1 mm to 1.3 mm, and the thickness is set to range from about 0.1 mm to 1.3 mm.

The element body 25 is formed as a stacked body in which a plurality of rectangular plate-shaped dielectric layers 22 (dielectrics: the second functional layer) and a plurality of inner electrodes 23A and inner electrodes 23B are stacked. The inner electrodes 23A and the inner electrodes 23B are arranged layer by layer in a stacking direction of the dielectric layers 22 in the element body 25. The inner electrodes 23A and the inner electrodes 23B are arranged to face each other with at least one dielectric layer 22 therebetween. The plurality of dielectric layers 22 are integrated such that boundaries therebetween are not visible. Outside an area in which the inner electrodes 23A and 23B and the dielectric layers 22 are alternately stacked, the dielectric layers 22 are disposed to interpose the area therebetween in the stacking direction.

The inner electrodes 23A and 23B are formed of the same conductive material as the first electrode layer 11 and the second electrode layer 12 of the first electronic component 10. The thickness of each of the inner electrodes 23A and 23B ranges, for example, from about 1 µm to 5 µm. The shape of the inner electrodes 23A and 23B is not particularly limited as long as the shape can have an overlapping area in the stacking direction, and, for example, may be a rectangular shape. The inner electrodes 23A are electrically connected to the connection electrode 21A, and the inner electrodes 23B are electrically connected to the connection electrode 21B.

The dielectric layers 22 are formed of a perovskite type dielectric material, similarly to the dielectric layer 13 of the first electronic component 10. A thickness of each dielectric layer 22 ranges, for example, from about 1 µm to 5 µm.

The connection electrodes 21A and 21B have a "⊃-shaped" cross-sectional shape. The connection electrodes 21A and 21B are formed by attaching a conductive paste including copper (Cu), nickel (Ni), silver (Ag), or palladium (Pd) as a main component to an outer surface of the element body 25, baking the resultant structure at a predetermined temperature (for example, about 700° C.), and performing electroplating on the resultant structure. Copper (Cu), nickel (Ni), tin (Sn), or the like can be used for the electroplating.

The first electronic component 10 and the second electronic component 20 are electrically connected to each other via conductive materials 31 and 32. The first electronic component 10 and the second electronic component 20 are stacked such that one principal surface 25c of the element body 25 of the second electronic component 20 faces the second electrode layer 12 of the first electronic component 10. One electrode layer 121 of the second electrode layer 12 of the first electronic component 10 is connected to one connection electrode 21A of the second electronic component 20 via the conductive material 31. Accordingly, a pair of electrodes (the inner electrode 23A and the connection electrode 21A, or the inner electrode 23B and the connection electrode 21B) constituting the second electronic component 20 are electrically connected to different electrode layers 121 and 122 of the second electrode layer 12 of the first electronic component 10.

The conductive material 31 is disposed to connect a bottom surface of the electrode layer 121 (a surface opposite the dielectric layer 13 side) constituting the second electrode layer 12 of the first electronic component 10 to an outer surface on the principal surface 25c side of the connection electrode 21A. One electrode layer 122 of the second electrode layer 12 of the first electronic component 10 is connected to one connection electrode 21B of the second electronic component 20 via the conductive material 32. The conductive material 32 is disposed to connect a bottom surface of the electrode layer 122 (a surface opposite the dialectic layer 13 side) constituting the second electrode layer 12 of the first electronic component 10 to an outer surface on the principal surface 25c side of the connection electrode 21B.

The material of the conductive materials 31 and 32 are not particularly limited as long as it has electrical conductivity, but, for example, materials of which the main component is nickel (Ni), copper (Cu), silver (Ag), gold (Au), platinum (Pt), or alloys or intermetallic compounds containing these metals can be suitably used. A solder alloy or the like may be used. In the electronic component 1 according to this embodiment, the conductive materials 31 and 32 also have a function of physically connecting the first electronic component 10 and the second electronic component 20 to each other. Accordingly, it is preferable that the conductive materials 31 and 32 be a material of which hardness varies. The solder alloy can be suitably used as the conductive materials 31 and 32 from this point of view. When the cured conductive materials 31 and 32 have hardness smaller than those of the second electrode layer 12 and the connection electrodes 21A and 21B, deformation, breakage, or the like of the second electrode layer 12 and the connection electrodes 21A and 21B due to a force applied from the outside can be prevented.

In the electronic component 1, an insulating material 40 is disposed between the conductive materials 31 and 32 and between the first electronic component 10 and the second electronic component 20. The insulating material 40 is disposed to come in contact with the dielectric layer 13 of the first electronic component 10, the electrode layers 121 and 122 of the second electrode layer 12, the principal surface 25c of the element body 25 of the second electronic component 20, the connection electrodes 21A and 21B, and the conductive materials 31 and 32. The material of the insulating material 40 is not particularly limited as long it is an insulating material, but, for example, a resin material which is used as a sealing resin such as a non-conductive paste (NCP) can be suitably used. It is preferable that the insulating material 40 be disposed to be in contact with the first electronic component 10, the second electronic component 20, and the conductive materials 31 and 32. By employing this configuration, these constituent members can be physically connected to and integrated with the insulating material 40. Particularly, it is preferable that the insulating material 40 be disposed to fill a space which is surrounded by the first electronic component 10, the second electronic component 20, and the conductive materials 31 and 32. In this case, a state in which the constituent members have been integrated with the insulating material 40 can be suitably maintained.

As described above, the insulating material 40 has a function of physically connecting the first electronic component 10 and the second electronic component 20 in addition to a function of securing insulation between a conductive area close to the electrode layer 121, the conductive material 31, and the connection electrode 21A and a conductive area close to the electrode layer 122, the conductive material 32, and the connection electrode 21B. Accordingly, insulating material 40 is preferably a material of which hardness can vary to be integrated with the above-mentioned elements and for example, a thermoplastic resin or a thermosetting resin can be suitably used.

In the electronic component 1, the electrode layers 111 to 114 constituting the first electrode layer 11 of the first electronic component 10 serve as terminal electrodes which are connected to an external electronic component or the like. The electrode layers 121 and 122 constituting the second electrode layer 12 of the first electronic component 10 are electrically connected to the connection electrodes 21A and 21B of the second electronic component 20.

The first electronic component 10 and the second electronic component 20 of the electronic component 1 satisfy a relationship that the second electronic component 20 is larger in capacitance than the first electronic component 10. The first electronic component 10 and the second electronic component 20 also satisfy a relationship that the second electronic component 20 is larger in equivalent series inductance (ESL) than the first electronic component 10. As a result, it is possible to achieve an increase in capacity and a decrease in ESL in the electronic component 1 as a whole. This will be described later.

A method of manufacturing the electronic component 1 will be described below with reference to FIGS. 2A to 2C and FIGS. 3A to 3C. In this embodiment, a sequence of stacking layers corresponding to the first electronic component 10 and then attaching the second electronic component 20 thereto will be described, but the present invention is not limited to this sequence.

Figure 2A:
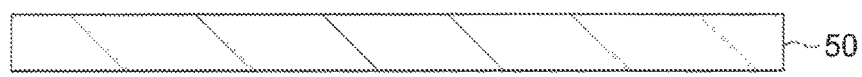
FIG. 2A is diagram illustrating a method of manufacturing an electronic component.
Figure 2B:
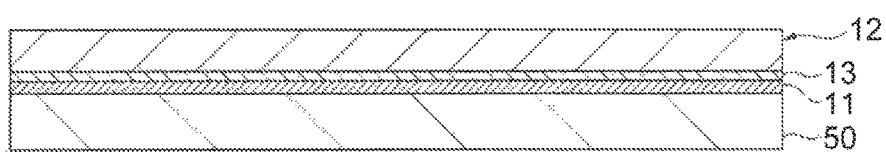
FIG. 2B is diagram illustrating a method of manufacturing an electronic component.
Figure 2C:
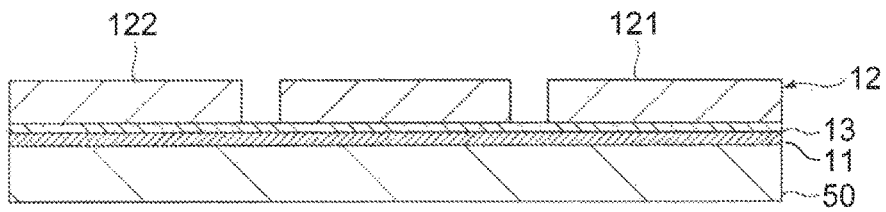
FIG. 2C is diagram illustrating a method of manufacturing an electronic component.

First, as illustrated in FIG. 2A, a substrate 50 which is used to stack layers corresponding to the first electronic component 10 thereon is prepared. The substrate 50 is used as a support member on which layers corresponding to the first electronic component 10 are stacked and the material thereof is not particularly limited. Then, as illustrated in FIG. 2B, a metal layer which becomes the first electrode layer 11, the dielectric layer 13, and a metal layer which becomes the second electrode layer 12 are stacked in this order on the substrate 50. Thereafter, as illustrated in FIG. 2C, processing based on the shape of the second electrode layer 12 of the first electronic component 10 is performed by patterning. As a result, similarly to the first electronic component 10 illustrated in FIG. 1, the electrode layers 121 and 122 are formed. Processing of dividing the first electrode layer 11 into a plurality of electrode layers may be performed before the dielectric layer 13 and the second electrode layer 12 are stacked, or may be performed after the second electronic component 20 is attached.

Figure 3A:
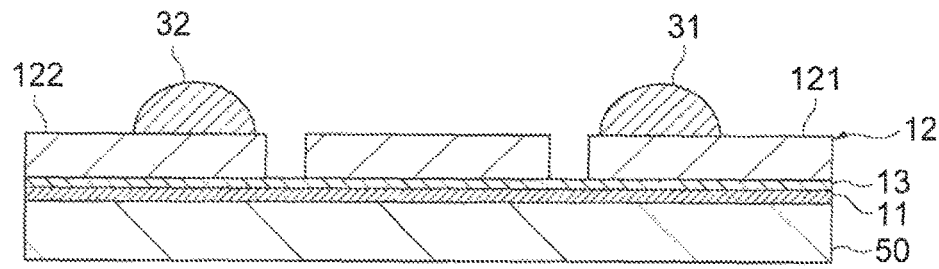
FIG. 3A is diagram illustrating the method of manufacturing an electronic component.
Figure 3B:
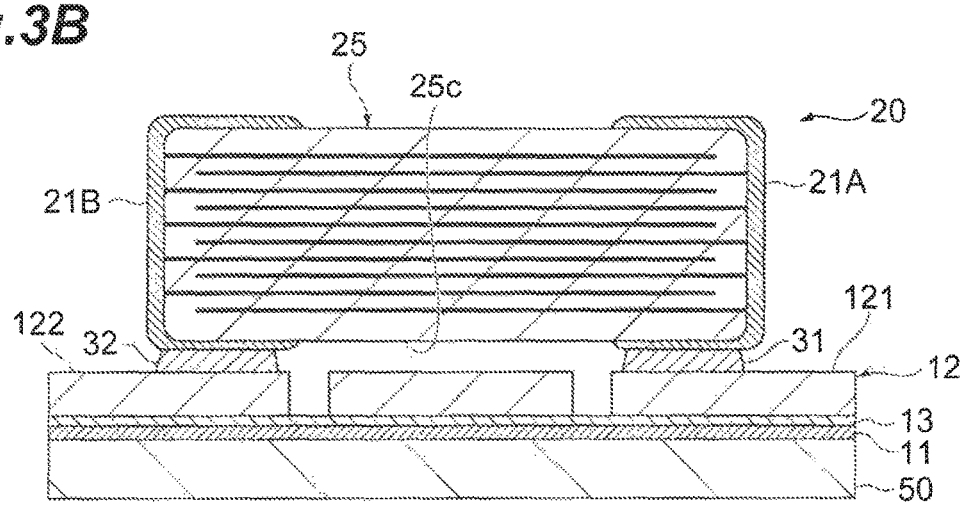
FIG. 3B is diagram illustrating the method of manufacturing an electronic component.

Then, as illustrated in FIG. 3A, the conductive material 31 is formed on the electrode layer 121 of the second electrode layer 12, and the conductive material 32 is formed on the electrode layer 122. In FIG. 3A, the conductive materials 31 and 32 are a solder alloy and has fluidity. Then, in the state in which the conductive materials 31 and 32 have fluidity, the second electronic component 20 is stacked on the conductive materials 31 and 32 as illustrated in FIG. 3B. More specifically, in a state in which one principal surface 25c of the element body 25 of the second electronic component 20 faces the second electrode layer 12, the second electronic component 20 is made to approach the layers corresponding to the first electronic component 10 such that the connection electrode 21A comes into contact with the conductive material 31 and the connection electrode 21B comes into contact with the conductive material 32. When the conductive materials 31 and 32 are cured in this state, the second electronic component 20 can be integrated with the stacked body in which the layers corresponding to the first electronic component 10 are stacked by the conductive materials 31 and 32.

The second electronic component 20 can be manufactured using a known method. The second electronic component 20 is formed, for example, by forming the element body 25 in which the dielectric layer 22 and the inner electrodes 23A and 23B are alternately stacked and then attaching the connection electrodes 21A and 22B thereto, but a specific sequence thereof is not particularly limited.

Figure 3C:
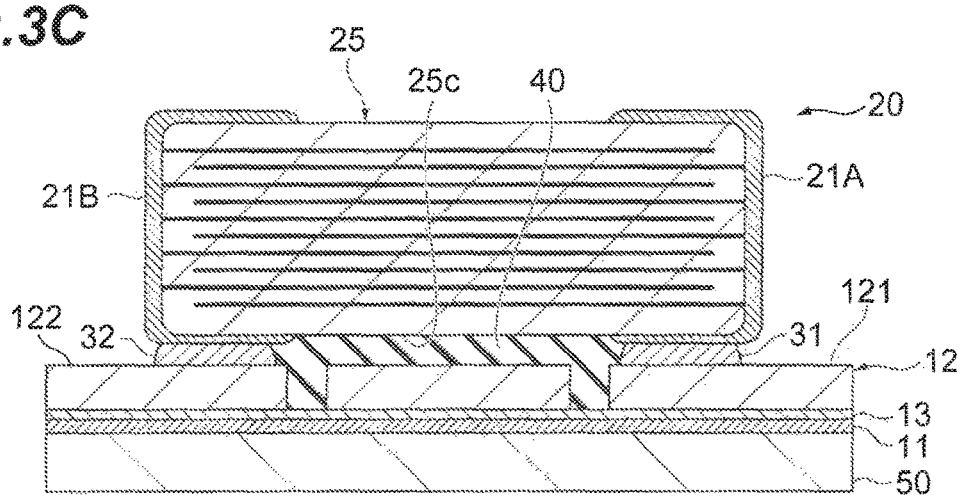
FIG. 3C is diagram illustrating the method of manufacturing an electronic component.

As illustrated in FIG. 3C, After the second electronic component 20 is attached to the first electrode layer 11, the dielectric layer 13, and the second electrode layer 12 corresponding to the first electronic component 10 via the conductive materials 31 and 32, the insulating material 40 is disposed between the principal surface 25c, the second electrode layer 12, and the dielectric layer 13. Specifically, a liquid insulating material is made to flow between the principal surface 25c and the second electrode layer 12 and the dielectric layer 13 and then is cured. Thereafter, the electronic component 1 illustrated in FIG. 1 is obtained by removing the substrate 50 and patterning the first electrode layer 11 if necessary.

Figure 4A:
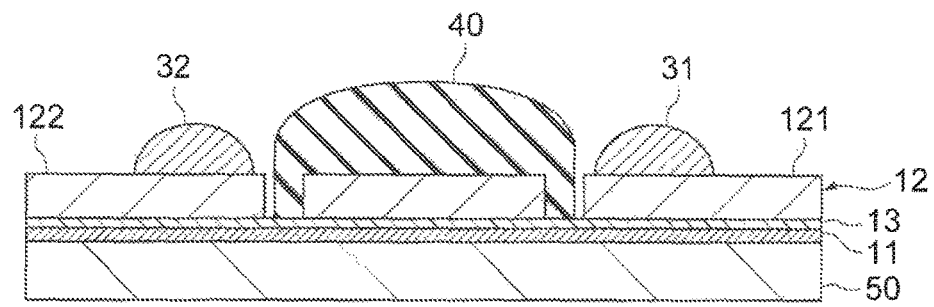
FIG. 4A is diagram illustrating a modified example of the method of manufacturing an electronic component.
Figure 4B:
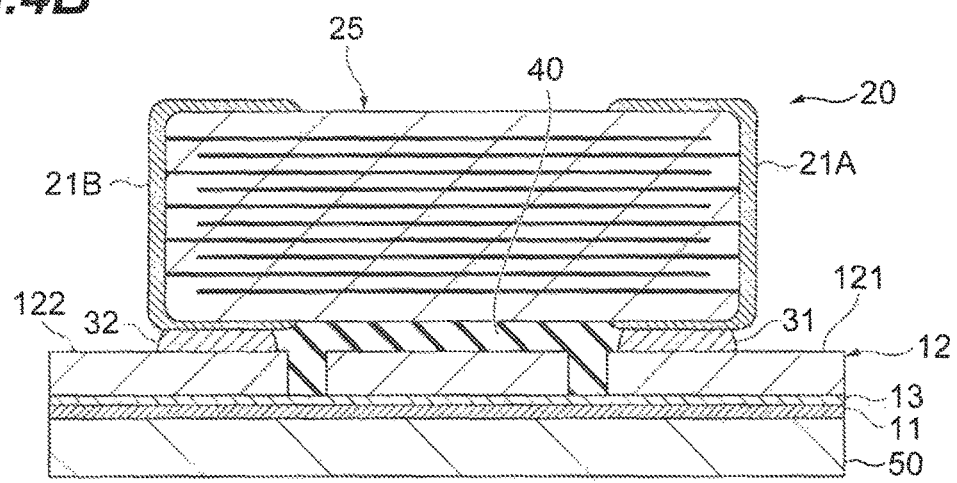
FIG. 4B is diagram illustrating a modified example of the method of manufacturing an electronic component.

The method of disposing the insulating material 40 after the second electronic component 20 is attached to the first electronic component 10 is described above, but the insulating material 40 may be formed before the stacked body in which the layers corresponding to the first electronic component 10 are stacked is integrated with the second electronic component 20. Specifically, as illustrated in FIG. 4A, the insulating material 40 is disposed between the conductive materials 31 and 32. In FIG. 4A, the insulating material 40 has fluidity. In the example illustrated in FIG. 4A, an electrode layer (a metal layer) other than the electrode layers 121 and 122 is covered with the insulating material 40, but the metal layer may not be present in an area covered with the insulating material 40 depending on the shape of the second electrode layer 12 as illustrated in FIG. 1. The metal layer covered with the insulating material is a layer which does not function as an electrode and thus may be removed. In this way, in the state in which the conductive materials 31 and 32 and the insulating material 40 have fluidity, the second electronic component 20 is stacked on the conductive materials 31 and 32 and the insulating material 40 as illustrated in FIG. 4B. Thereafter, by curing the conductive materials 31 and 32 and the insulating material 40, the stacked body in which the layers corresponding to the first electronic component 10 are stacked is integrated with the second electronic component 20. In this way, the same state as the state illustrated in FIG. 3C can be achieved.

Since the electronic component 1 has the above-mentioned configuration, it is possible to more easily make an increase in capacity and an improvement in signal quality in a high-frequency range be compatible with each other in comparison with a thin capacitor in the related art.

The thin capacitor in the related art has a structure in which the thickness of the dielectric layer 13 is decreased like the first electronic component 10. In this case, since transmission path can be shortened, it is possible to realize a decrease in ESL. The ESL is an inductance component resulting from an inner electrode of a capacitor or the like. The capacitor has impedance increasing depending on the ESL in a high-frequency range. Accordingly, a decrease in ESL of a capacitor is important for an improvement in signal quality in a high-frequency range. It is known that a thin capacitor is advantageous for a decrease in ESL from the viewpoint of structure.

However, it is difficult to increase capacitance of the thin capacitor. An increase in dielectric constant of a dielectric layer, an increase in area of electrodes, or a decrease in thickness of a dielectric is necessary for increasing capacitance of the thin capacitor in the related art, but it is not easy to satisfy these requirements.

On the other hand, in the electronic component 1, by stacking and connecting the second electronic component 20 having greater capacitance than that of the first electronic component 10 on and to the first electronic component 10, compatibility of an increase in capacity and a decrease in ESL can be made to be possible. Specifically, since the capacitance of the electronic component 1 can be covered with the capacity of the second electronic component 20 by employing a high-capacity electronic component as the second electronic component 20, it is possible to easily achieve an increase in capacity.

It is preferable that the capacitance of the second electronic component 20 be several times the capacitance of the first electronic component 10. When the capacitance of the second electronic component 20 is excessively greater than that of the first electronic component 10, occurrence of anti-resonance is known.

The electrode layers 121 and 122 constituting the second electrode layer 12 of the first electronic component 10 are connected to the connection electrodes 21A and 21B of the second electronic component 20 via the conductive materials 31 and 32, respectively, and the capacitors 10A and 10B formed by the first electronic component 10 are arranged with the second electronic component 20 interposed therebetween and are connected to an external electronic component or the like via the electrode layers 111 to 114 of the first electrode layer 11 of the first electronic component 10. The first electronic component 10 is lower in ESL than the second electronic component 20. In the related art, an MLCC such as the second electronic component 20 is known as a high-capacitance capacitor, but according to the electronic component 1 having the above-mentioned configuration, it is possible to achieve an ESL lower than that in the MLCC according to the related art.

It is preferable that the ESL of the second electronic component 20 be ten times the ESL of the first electronic component 10. According to this relationship, an effect of decreasing the ESL due to the configuration of the electronic component 1 is greatly enhanced.

In the electronic component 1, since the first electronic component 10 and the second electronic component 20 are stacked, a current path between the first electronic component 10 and the second electronic component 20 can be further shortened. When a plurality of capacitors are connected, the capacitors arranged on a plane are generally connected to each other via a conductor or the like. However, in this case, a current path is lengthened and the ESL increases in view of the whole connected capacitors. On the other hand, in the electronic component 1, by employing the configuration in which the current path between the first electronic component 10 and the second electronic component 20 is shortened, it is possible to further promote a decrease in ESL of the electronic component 1 as a whole.

In this way, the electronic component 1 according to this embodiment can achieve an increase in capacity and a decrease in ESL in comparison with the thin capacitor according to the related art, thereby achieving an improvement in signal quality in a high-frequency range.

In the electronic component 1 according to this embodiment, the electrode layers 111 to 114, which function as terminal electrodes connected to an external electronic component or the like, constituting the first electrode layer 11 of the first electronic component 10 are divided into four electrode layers. In order for the first electronic component 10 to function as two capacitors 10A and 10B, two electrode layers have to be formed to face the electrode layers 121 and 122 of the second electrode layer. On the other hand, in the electronic component 1, the electrode layers 111 and 112 face the electrode layer 121 of the second electrode layer, and the electrode layers 113 and 114 face the electrode layer 122 of the second electrode layer. By employing this configuration, it is possible to achieve a further decrease in ESL of the electronic component 1 and to further improve signal quality in a high-frequency range of the electronic component 1. In this embodiment, an example in which the first electrode layer is divided into four (2×2) electrode layers has been described above, but the number of electrode layers divided can be appropriately changed.

In the electronic component 1 according to this embodiment, the insulating material 40 is disposed between the first electronic component 10 and the second electronic component 20 (and between the conductive materials 31 and 32). Since the insulating material 40 can physically connect the first electronic component 10 and the second electronic component 20 to each other by employing this configuration, it is possible to improve durability of the electronic component 1. Since the insulating material 40 can secure insulation between the conductive area close to the electrode layer 121, the conductive material 31, and the connection electrode 21A and the conductive area close to the electrode layer 122, the conductive material 32, and the connection electrode 21B, it is possible to improve insulation reliability.

In the electronic component 1 according to this embodiment, the first electronic component 10 and the second electronic component 20 are connected to each other by the conductive materials 31 and 32. In this case, since the conductive materials 31 and 32 physically connect the first electronic component 10 and the second electronic component 20 to each other, it is possible to improve durability of the electronic component 1. When the conductive materials 31 and 32 have hardness smaller than that of the second electrode layer 12 and the connection electrodes 21A and 21B, it is possible to prevent deformation, breakage, or the like of the second electrode layer 12 and the connection electrodes 21A and 21B due to a force applied thereto from the outside. By employing the configuration in which the first electronic component 10 and the second electronic component 20 are connected to each other by the conductive materials 31 and 32 which are thermally curable or the like, the first electronic component 10 and the second electronic component 20 can be suitably supported by curing the conductive materials 31 and 32, and it is thus possible to improve durability and connection reliability of the electronic component 1.

Figure 5:
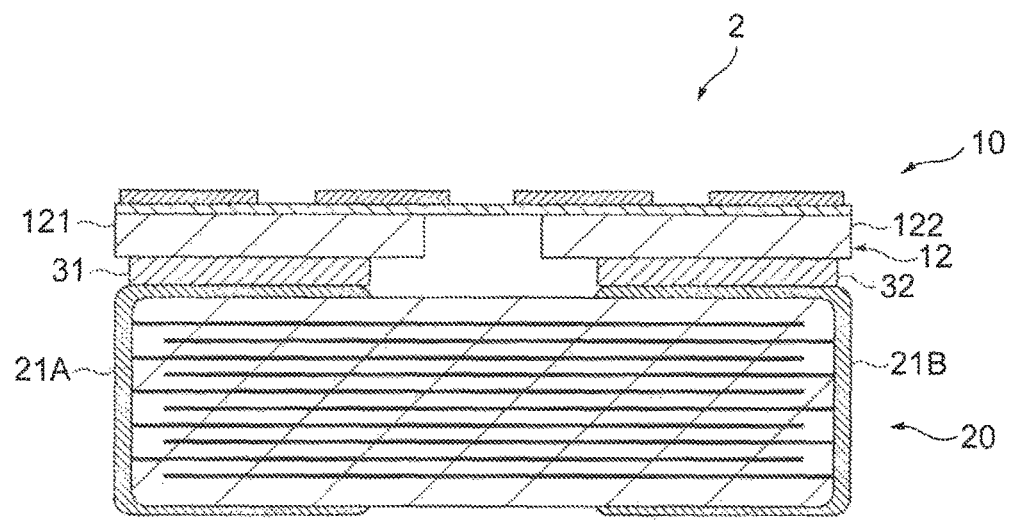
FIG. 5 is a cross-sectional view schematically illustrating an electronic component according to a modified example.
Figure 6:
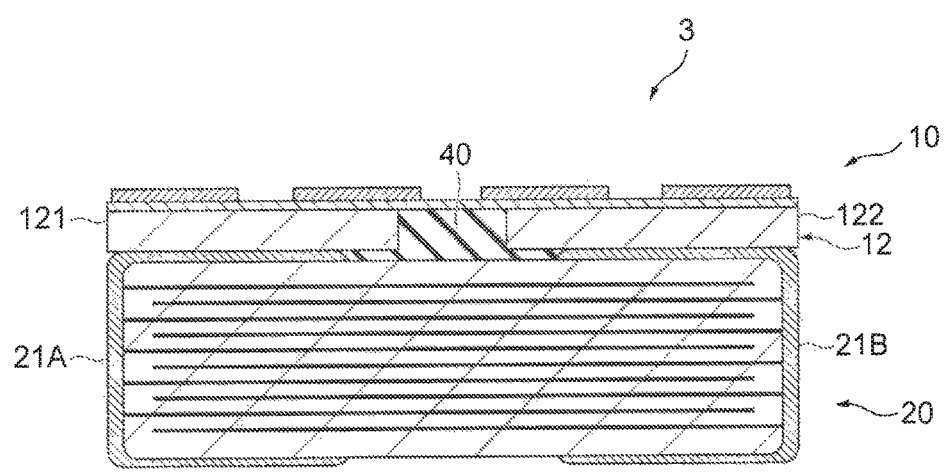
FIG. 6 is a cross-sectional view schematically illustrating an electronic component according to a modified example.

In FIGS. 5 and 6, electronic components according to modified examples of the electronic component 1 according to this embodiment are illustrated. An electronic component 2 illustrated in FIG. 5 is different from the electronic component 1 illustrated in FIG. 1, in that the insulating material 40 is not provided. In this way, even when the insulating material 40 is not provided, the electrode layers 121 and 122 constituting the second electrode layer 12 of the first electronic component 10 are connected to the connection electrodes 21A and 21B of the second electronic component 20 via the conductive materials 31 and 32 and thus both electronic components are integrated as an electronic component. Accordingly, in the electronic component 2, since an increase in capacity and a decrease in ESL can be achieved, it is possible to achieve an improvement in signal quality in a high-frequency range.

An electronic component 3 illustrated in FIG. 6 is different from the electronic component 1 illustrated in FIG. 1, in that the conductive materials 31 and 32 are not provided. That is, the first electronic component 10 and the second electronic component 20 are connected directly to each other. An example of a method of directly connecting the electrode layers 121 and 122 of the first electronic component 10 to the connection electrodes 21A and 21B of the second electronic component 20 in this way may be welding, but the connecting method is not particularly limited. In the configuration in which the first electronic component 10 and the second electronic component 20 are connected directly to each other as in the electronic component 3, a distance between the first electronic component 10 and the second electronic component 20 is shorter than that in the electronic component 1 illustrated in FIG. 1. That is, a current path in the electronic component 1 can be decreased. Accordingly, an effect of a decrease in ESL is improved in comparison with the electronic component 1. In the electronic component 3, a configuration in which the insulating material 40 is not provided may be employed similarly to the electronic component 2.

While an embodiment of the present invention has been described above, the present invention is not limited to the above-mentioned embodiment and can be modified in various forms without departing from the gist of the present invention.

For example, in the embodiment, a configuration in which one second electronic component 20 is connected to one first electronic component 10 has been described, but a configuration in which a plurality of second electronic components 20 are connected to one first electronic component 10 may be employed. In this case, the second electrode layer 12 of the first electronic component 10 may be divided into at least two electrode layers as in the above-mentioned embodiment, or may be divided to correspond to electrodes of the plurality of second electronic components 20. Division of the first electrode layer 11 into electrode layers equal to or more than the number of divided electrode layers of the second electrode layer 12 is the same as in the electronic component 1. When a configuration in which a plurality of second electronic components 20 are combined with the first electronic component 10 is employed, it is possible to further enhance capacitance of an electronic component and to achieve an improvement in performance as an electronic component.

In the above-mentioned embodiment, a case in which the first electronic component 10 is a TFCP and the second electronic component 20 is an MLCC has been described, but the first electronic component 10 and the second electronic component 20 are not limited to the above-specified types of capacitors and can be appropriately changed. The shape and arrangement of a plurality of electrode layers included in the second electrode layer 12 of the first electronic component 10 can be changed depending on the shape, arrangement, or the like of the electrodes of the second electronic component 20. The shape and arrangement of a plurality of electrode layers included in the first electrode layer 11 can be changed depending on the shape, arrangement, and the like of a plurality of electrode layers.

Combination of Other Electronic Components

In the electronic components 1 to 3, the first electronic component 10 is a TFCP and the second electronic component 20 is an MLCC. However, a combination of two electronic components constituting the electronic component according to the embodiment of the present invention is not limited thereto. Hereinafter, modifications of the combination of two electronic components will be described.

Examples of a thin-film-shaped first electronic component included in the electronic component according to the embodiment of the present invention include an inductor, a resistor, a fuse, and a capacitor+resistor, in addition to the capacitor described above in the embodiment. In a configuration in which the first electronic component is formed as an inductor, for example, FeNi (permalloy) or CoTaZr soft magnetic layer instead of the dielectric layer can be used as the first functional layer interposed between the first electrode layer 11 and the second electrode layer 12. In a configuration in which the first electronic component is formed as a resistor, for example, NiCrTa, TaN, or Ta—SiO2 which is an Ni—Cr-based resistor material can be used as the first functional layer interposed between the first electrode layer 11 and the second electrode layer 12. In a configuration in which the first electronic component is formed as a thermistor, for example, a composite compound including Mn, Co, Ni, or Fe can be used as the first functional layer interposed between the first electrode layer 11 and the second electrode layer 12. In a configuration in which the first electronic component is formed as a fuse, for example, BaTiO3 can be used as the first functional layer interposed between the first electrode layer 11 and the second electrode layer 12.

On the other hand, examples of a chip-shaped second electronic component included in the electronic component according to the embodiment of the present invention include an inductor, a resistor, and a fuse in addition to the capacitor described above in the embodiment. In a configuration in which the second electronic component is formed as an inductor, a resistor, or a fuse, the material of the second functional layer interposed between at least a pair of metals is the same as the material which is used for the first functional layer in a configuration in which the first electronic component is formed as an inductor, a resistor, or a fuse.

A combination of types (configurations) of the first electronic component and the second electronic component in the electronic component according to the embodiment of the present invention is not particularly limited, but the combination of the first electronic component and the second electronic component for allowing the electronic component to exhibit a desired function is limited to specific ones. For example, when the first electronic component is a capacitor, a capacitor (the electronic components 1 to 3 described above in the embodiment), an inductor, or a fuse can be combined therewith as the second electronic component. When the first electronic component is a capacitor and the second electronic component is a capacitor as described above in the embodiment, the resultant electronic component has a function of reducing ESL. When the first electronic component is a capacitor and the second electronic component is an inductor, the resultant electronic component has a function of decreasing resistance of a circuit. When the first electronic component is a capacitor and the second electronic component is a fuse, the resultant electronic component functions as a filter.

When the first electronic component is an inductor, a capacitor can be combined therewith as the second electronic component. When the first electronic component is an inductor and the second electronic component is a capacitor, the resultant electronic component functions as a filter.

When the first electronic component is a resistor, a capacitor or a thermistor can be combined therewith as the second electronic component. When the first electronic component is a resistor and the second electronic component is a capacitor, the resultant electronic component has a function of decreasing resistance in a circuit. When the first electronic component is a resistor and the second electronic component is a thermistor, the resultant electronic component has a function of adjusting resistance value depending on the temperature.

When the first electronic component is a thermistor, a resistor can be combined therewith as the second electronic component. When the first electronic component is a resistor and the second electronic component is a thermistor, the resultant electronic component has a function of decreasing resistance in a circuit.

When the first electronic component is a fuse, a capacitor can be combined therewith as the second electronic component. When the first electronic component is a fuse and the second electronic component is a capacitor, the capacitor is cut off by the fuse to secure safety even when the capacitor is short-circuited by a large current.

When the first electronic component is a capacitor+ resistor, a capacitor can be combined therewith as the second electronic component. When the first electronic component is a capacitor+resistor and the second electronic component is a capacitor, the resultant electronic component can adjust anti-resonance of impedance and can achieve a decrease in ESL.

When the first electronic component is a capacitor+ resistor, an inductor can be combined therewith as the second electronic component. When the first electronic component is a capacitor+resistor and the second electronic component is an inductor, the resistor functions as a damping resistor.

Figure 7:
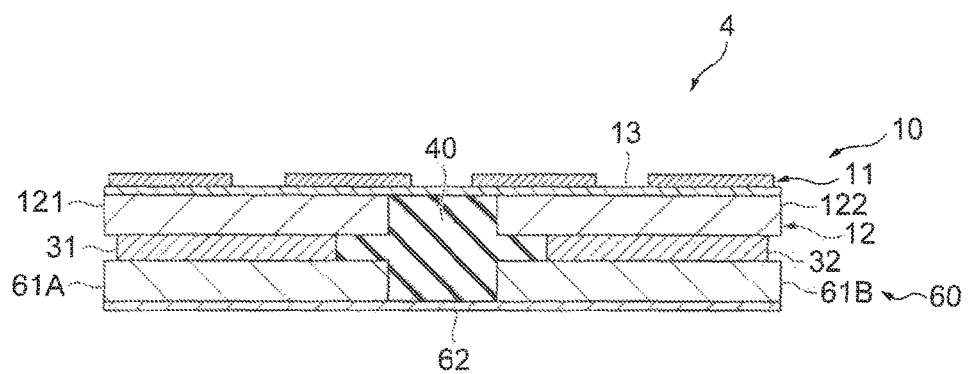
FIG. 7 is a cross-sectional view schematically illustrating an electronic component according to a modified example.

As described above, it is possible to obtain an electronic component in which two electronic components are combined by connecting at least a pair of electrodes of the second electronic component to different electrode layers included in the second electrode layer of the first electronic component regardless of the combinations of the first electronic component and the second electronic component. As a result, when use of a combination of a plurality of electronic components is requested, it is possible to efficiently arrange and connect a plurality of electronic components. There may be a demand for arranging a plurality of electronic components on a substrate with a recent improvement in function of electronic devices or depending on applications of the electronic device, and it is conceivable that a ratio of an area occupied by a plurality of electronic components on the substrate increases when the plurality of electronic components are arranged on the substrate. On the other hand, when a plurality of chip-shaped electronic components are stacked on the substrate in the vertical direction, it is necessary to secure a satisfactory height for arranging the electronic components and there is a likelihood that wiring for the electronic components will be complicated. On the other hand, as in the electronic component according to this embodiment, by combining the second electronic component with the first electronic component which is a thin-film electronic component including a first electrode layer, a second electrode layer, and a first functional layer, it is possible to more efficiently arrange and connect two electronic components in comparison with the arrangement and connection of the electronic components in the related art, In the above-mentioned embodiment, an example in which the second electronic component is a chip-shaped electronic component has been described above, the second electronic component may be a thin-film electronic component similarly to the first electronic component. FIG. 7 is a diagram illustrating an electronic component 4 when the second electronic component is a thin-film electronic component. In the electronic component 4 illustrated in FIG. 7, a second electronic component 60 includes a pair of electrode layers 61A and 61B and a dielectric layer 62 as a second functional layer. The electrode layer 61A is electrically connected to the electrode layer 121 of the second electrode layer 12 of the first electronic component 10 via the conductive material 31. Similarly, the electrode layer 61B is electrically connected to the electrode layer 122 of the second electrode layer 12 of the first electronic component 10 via the conductive material 32. When the second electronic component 60 is formed as a thin-film electronic component in this way, a low profile of the electronic component can be achieved. Even when both the first electronic component 10 and the second electronic component 20 are formed as thin-film electronic components, it is possible to appropriately maintain a state in which the electronic components have been integrated with each other by disposing the insulating material 40 therebetween.

What is claimed is:

1. An electronic component comprising:
   a first electronic component that includes a first functional layer and a first and second electrode layer which are disposed to interpose the first functional layer therebetween; and
   a second electronic component that is stacked on the first electronic component and includes a second functional layer and at least a pair of electrodes which are disposed to interpose the second functional layer therebetween,
   wherein the second electrode layer of the first electronic component includes a plurality of divided electrode layers,
   the pair of electrodes of the second electronic component are each electrically connected to different electrode layers which are included in the plurality of electrode layers of the second electrode layer; and
   a conductive material is disposed between the pair of electrodes of the second electronic component and the electrode layers which are included in the second electrode layer and which are electrically connected to the pair of electrodes of the second electronic component.

2. The electronic component according to claim 1, wherein an insulating material that comes into contact with the first electronic component and the second electronic component is disposed in an area which is disposed between the first electronic component and the second electronic component and which is different from an area in which both electronic components are electrically connected to each other.

3. An electronic component comprising:
   a first electronic component that includes a dielectric layer and a first and second electrode layer which are disposed to interpose the dielectric layer therebetween; and
   a second electronic component that is stacked on the first electronic component and includes a dielectric and a pair of electrodes which are disposed to interpose the dielectric therebetween,
   wherein the second electrode layer of the first electronic component includes a plurality of divided electrode layers,
   the pair of electrodes of the second electronic component are each electrically connected to different electrode layers which are included in the plurality of electrode layers of the second electrode layer,
   the first electrode layer of the first electronic component is divided into a plurality of electrode layers to correspond to the electrode layers which are included in the second electrode layer and which are electrically connected to the pair of electrodes of the second electronic component,
   capacitance of the second electronic component is greater than capacitance of the first electronic component, and
   equivalent series inductance of the second electronic component is greater than equivalent series inductance of the first electronic component.

4. The electronic component according to claim 3, wherein a part of an area in the first electrode layer corresponding to the electrode layers which are included in the second electrode layer and electrically connected to the pair of electrodes of the second electronic component is divided into a plurality of areas.

5. The electronic component according to claim 3, wherein an insulating material that comes into contact with the first electronic component and the second electronic component is disposed in an area which is disposed between the first electronic component and the second electronic component and which is different from an area in which both electronic components are electrically connected to each other.

6. The electronic component according to claim 3, wherein a conductive material is disposed between the pair of electrodes of the second electronic component and the electrode layers which are included in the second electrode layer and which are electrically connected to the pair of electrodes of the second electronic component.

* * * * *